United States Patent
Sun

(10) Patent No.: US 11,031,779 B2
(45) Date of Patent: Jun. 8, 2021

(54) MEMORY SYSTEM WITH A RANDOM BIT BLOCK

(71) Applicant: eMemory Technology Inc., Hsin-Chu (TW)

(72) Inventor: Wein-Town Sun, Hsinchu County (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 16/848,808

(22) Filed: Apr. 14, 2020

(65) Prior Publication Data

US 2020/0395081 A1    Dec. 17, 2020

Related U.S. Application Data

(60) Provisional application No. 62/861,329, filed on Jun. 14, 2019.

(51) Int. Cl.
| | |
|---|---|
| *G11C 16/26* | (2006.01) |
| *G11C 16/04* | (2006.01) |
| *G11C 16/08* | (2006.01) |
| *G11C 16/12* | (2006.01) |
| *G11C 16/24* | (2006.01) |
| *G11C 7/06* | (2006.01) |

(Continued)

(52) U.S. Cl.
CPC .............. *H02H 9/046* (2013.01); *G11C 7/06* (2013.01); *G11C 16/0441* (2013.01); *G11C 16/08* (2013.01); *G11C 16/12* (2013.01); *G11C 16/14* (2013.01); *G11C 16/24* (2013.01); *G11C 16/26* (2013.01); *H01L 27/0255* (2013.01); *H01L 27/0277* (2013.01)

(58) Field of Classification Search
CPC ....... G11C 7/06; G11C 16/0441; G11C 16/08; G11C 16/12; G11C 16/14; G11C 16/24; G11C 16/26; G11C 7/24; G11C 16/28; G11C 16/22

See application file for complete search history.

(56) References Cited

U.S. PATENT DOCUMENTS 8,724,361 B2 * 5/2014 Pagliato ........... G11C 29/50004
365/63
9,508,396 B2    11/2016 Chen
(Continued)

FOREIGN PATENT DOCUMENTS

EP    3270539    1/2018

*Primary Examiner* — Gene N Auduong
(74) *Attorney, Agent, or Firm* — Winston Hsu

(57) ABSTRACT

A memory system includes a non-volatile memory block, a random bit block, and a sense amplifier. The non-volatile memory block includes a plurality of non-volatile memory cells for storing a plurality of bits of data. Each of the non-volatile memory cells includes a first storage transistor. The random bit block includes a plurality of random bit cells for providing a plurality of random bits. Each of the random bit cells includes a second storage transistor and a third storage transistor. The sense amplifier senses a first read current of a non-volatile memory cell during a read operation of the non-volatile memory cell and senses a second read current of a random bit cell during a read operation of the random bit cell. The first storage transistor, the second storage transistor, and the third storage transistor are storage transistors of the same type.

16 Claims, 3 Drawing Sheets

(51) Int. Cl.
*H02H 9/04* (2006.01)
*H01L 27/02* (2006.01)
*G11C 16/14* (2006.01)

(56) References Cited

U.S. PATENT DOCUMENTS 9,997,244 B1 6/2018 Chih
10,910,062 B2 * 2/2021 Lai .................... G11C 14/0063

* cited by examiner

MEMORY SYSTEM WITH A RANDOM BIT BLOCK

CROSS REFERENCE TO RELATED APPLICATIONS

This non-provisional application claims priority of U.S. provisional application No. 62/861,329, filed on Jun. 14, 2019, included herein by reference in its entirety.

BACKGROUND OF THE INVENTION

1. Field of the Invention

The present invention is related to a memory system, and more particularly, to a memory system with a random bit block.

2. Description of the Prior Art

As electronic devices include more and more functions, the electronic devices may adopt integrated circuits (ICs) manufactured by many different companies. For example, the controller may be manufactured by one company, and the power management IC (PMIC) for providing the required powers may be manufactured by another company. However, to ensure the electronic device can function normally, the power management IC must be compliant with the controller.

For example, in a wireless charging device, the power management IC would store the firmware program and related parameters for circuit protection. In this case, if the firmware program is changed by hackers, then the power management IC may fail to protect the whole device and become overheated, raising a safety concern. Therefore, how to protect the crucial data stored in the power management IC or in any other ICs from being hacked has become an issue.

SUMMARY OF THE INVENTION

One embodiment of the present invention discloses a memory system. The memory system includes a non-volatile memory block, a random bit block, and at least one sense amplifier.

The non-volatile memory block includes a plurality of non-volatile memory cells for storing a plurality of bits of data, and each of the plurality of non-volatile memory cells includes a first storage transistor. The random bit block includes a plurality of random bit cells for providing a plurality of random bits, and each of the plurality of random bit cells includes a second storage transistor and a third storage transistor. The at least one sense amplifier is coupled to the non-volatile memory block and the random bit block. The sense amplifier senses a first read current of a non-volatile memory cell of the plurality of non-volatile memory cells during a read operation of the non-volatile memory cell and senses at least a second read current of a random bit cell of the plurality of random bit cells during a read operation of the random bit cell.

The first storage transistor, the second storage transistor, and the third storage transistor are storage transistors of a same type.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
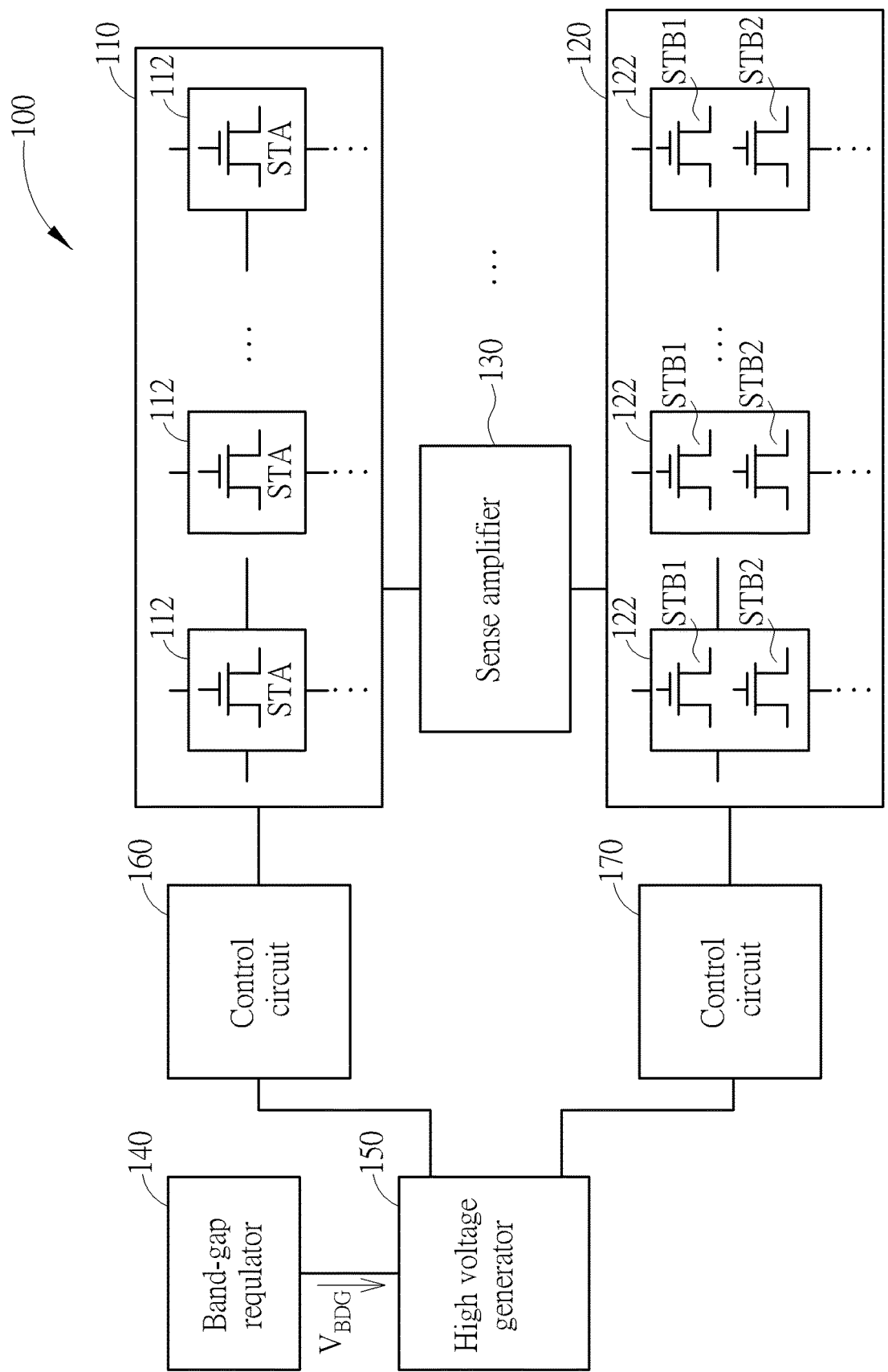
FIG. 1 shows a memory system according to one embodiment of the present invention.

FIG. 1 shows a memory system 100 according to one embodiment of the present invention. The memory system 100 includes a non-volatile memory block 110 and a random bit block 120.

The non-volatile memory block 110 includes a plurality of non-volatile memory cells 112 for storing a plurality of bits of data. Also, the random bit block 120 includes a plurality of random bit cells 122 for providing a plurality of random bits. That is, while the non-volatile memory block 110 can be used to store data, the random bit block 120 can be used to provide random bits for generating security keys and protecting the data stored in the non-volatile memory block 110.

For example, the memory system 100 can be used in a power management IC, and the non-volatile memory block 110 can be used to store the firmware program of the power management IC. In this case, the power management IC may use the random bits provided by the random bit block 120 to generate a security key. The security key can be used to encrypt and/or decrypt transmission data, ensuring that the data stored in the non-volatile memory block 110 can only be accessed by authorized people.

In some embodiments, each non-volatile memory cell 112 can include a storage transistor STA, and each random bit cell 122 can include storage transistors STB1 and STB2. Also, the storage transistors STA, STB1, and STB2 can be of a same type. That is, the storage transistors STA, STB1, and STB2 can be programmed according to the same principles. Therefore, the non-volatile memory block 110 and the random bit block 120 can be manufactured in the same process, and may also share some of circuits in the memory system 100.

For example, in FIG. 1, the memory system 100 can further include a sense amplifier 130. The sense amplifier 130 can be coupled to the non-volatile memory block 110 and the random bit block 120. In some embodiments, the sense amplifier 130 can sense a read current of a non-volatile memory cell 112 during a read operation of the non-volatile memory cell 112, and can sense a read current of a random bit cell 122 during a read operation of the random bit cell 122. That is, the sense amplifier 130 can be used to perform the read operation of the non-volatile memory cell 112 and the read operation of the random bit cell 122. In some embodiments, the non-volatile memory cells 112 can be coupled to different bit lines and the random bit cells 122 can also be coupled to different bit lines. In this case, the memory system 100 may include a plurality of sense amplifiers 130 to sense currents on the different bit lines in parallel.

Figure 2:
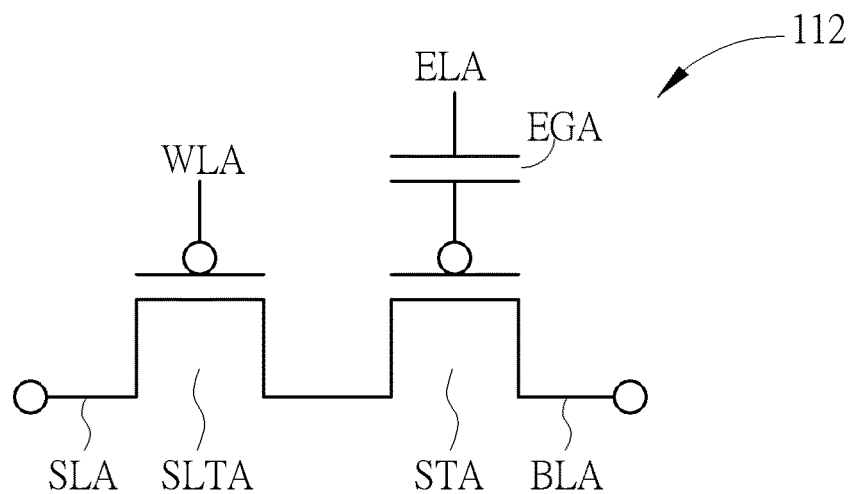
FIG. 2 shows the non-volatile memory cell according to one embodiment of the present invention.

FIG. 2 shows the non-volatile memory cell 112 according to one embodiment of the present invention. The non-volatile memory cell 112 includes a select transistor SLTA, the storage transistor STA, and an erase element EGA. The select transistor SLTA has a first terminal coupled to a source line SLA, a second terminal, and a control terminal coupled to a word line WLA. The storage transistor STA has a first terminal coupled to the second terminal of the select transistor SLTA, a second terminal coupled to a bit line BLA, and a floating gate terminal. The erase element EGA has a first terminal coupled to the floating gate terminal of the storage transistor STA, and a second terminal coupled to an erase line ELA.

In some embodiments, the select transistor SLTA and the storage transistor STA can be P-type transistors disposed in the same N-well NWA. Also, in some embodiments, the erase element EGA can be a capacitance component for coupling the floating gate of the storage transistor STA to the erase line ELA.

Table 1 shows the voltages applied to the source line SLA, the word line WLA, the bit line BLA, the erase line ELA, and the N-well NWA during the program operation, the erase operation, and the read operation.

TABLE 1

|  | Program operation | Erase operation | Read operation |
| --- | --- | --- | --- |
| SLA | VPP | V0 | VOP3 |
| WLA | VOP1 | V0 | V0 |
| BLA | V0 | V0 | VR |
| ELA | V0 to VOP1 | VEE | V0 |
| NWA | VPP | V0 | VOP3 |

According to table 1, during the program operation, the source line SLA and the N-well NWA can be at the program voltage VPP, the word line WLA can be at the operation voltage VOP1, the bit line BLA can be at the reference voltage V0, and the erase line ELA can range from the reference voltage V0 to the operation voltage VOP1. In some embodiments, the program voltage VPP can be greater than the operation voltage VOP1, and the operation voltage VOP1 can be greater than the reference voltage V0. For example, but not limited to, the program voltage VPP can be 8V, the operation voltage VOP1 can be 4V, and the reference voltage V0 can be 0V.

In this case, during the program operation, the selection transistor SLTA can be turned on so the first terminal of the storage transistor STA will receive the program voltage VPP while the second terminal of the storage transistor STA will receive the reference voltage V0 through the bit line BLA. Therefore, a strong electric field can be formed on the storage transistor STA, thereby inducing hot electron injection. Consequently, the floating gate of the storage transistor STA will capture the injected electrons, and the non-volatile memory cell 112 can be programmed.

Also, according to table 1, during the read operation of the non-volatile memory cell 122, the source line SLA and the N-well NWA can be at an operation voltage VOP3, the bit line BLA can be pre-charged to a read voltage VR, and the erase line ELA and the word line WLA can be at the reference voltage V0. In some embodiments, the operation voltage VOP3 can be greater than the read voltage VR, and the read voltage VR can be greater than the reference voltage V0. For example, but not limited to, the operation voltage VOP3 can be 2.5V, and the read voltage VR can be 0.4V.

In this case, the select transistor SLTA can be turned on. Also, if the non-volatile memory cell 112 has been programmed, the storage transistor STA will induce a read current flowing from the source line SLA to the bit line BLA. However, if the non-volatile memory cell 112 has not been programmed, no current or only an insignificant current will be induced. Therefore, by sensing the current on the bit line BLA with the sense amplifier 130, the programming state of the non-volatile memory cell 112 can be determined, and the stored data can be read.

Furthermore, in some embodiments, the non-volatile memory cell 112 can be multiple-times programmable (MTP) memory cell. That is, the non-volatile memory cell 112 that has been programmed can be erased by performing the erase operation. According to table 1, during the erase operation, the source line SLA, the bit line BLA, the word line WLA, and the N-well NWA can be at the reference voltage V0, and the erase line ELA can be at an erase voltage VEE. In some embodiments, the erase voltage VEE can be greater than the program voltage VPP. For example, but not limited to, the erase voltage VEE can be 13V to 14V. In this case, the electrons captured by the floating gate of the storage transistor STA will be ejected through the erase element EGA, and the non-volatile memory cell 112 can be erased.

Figure 3:
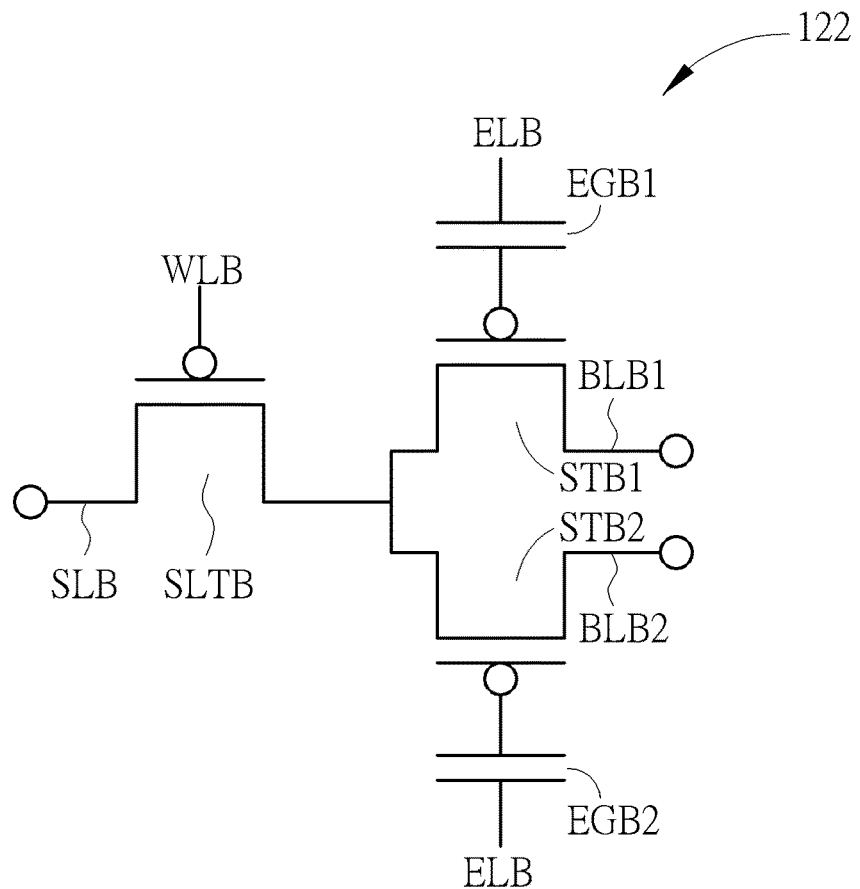
FIG. 3 shows the random bit cell according to one embodiment of the present invention.

In FIG. 2, the storage transistor STA of the non-volatile memory cell 112 can be implemented with a floating gate transistor. In this case, the storage transistors STB1 and STB2 of the random bit cell 122 can also be implemented with the floating gate transistors. FIG. 3 shows the random bit cell 122 according to one embodiment of the present invention. The random bit cell 122 includes a select transistor SLTB, erase elements EGB1 and EGB2, and the storage transistors STB1 and STB2.

The select transistor SLTB has a first terminal coupled to a source line SLB, a second terminal, and a control terminal coupled to a word line WLB. The storage transistor STB1 has a first terminal coupled to the second terminal of the select transistor SLTB, a second terminal coupled to a bit line BLB1, and a floating gate terminal. The storage transistor STB2 has a first terminal coupled to the second terminal of the select transistor SLTB, a second terminal coupled to a bit line BLB2, and a floating gate terminal.

The erase element EGB1 has a first terminal coupled to the floating gate terminal of the storage transistor STB1, and a second terminal coupled to an erase line ELB. The erase element EGB2 has a first terminal coupled to the floating gate terminal of the storage transistor STB2, and a second terminal coupled to the second erase line ELB.

In FIG. 3, the select transistor SLTB and the storage transistors STB1 and STB2 can be P-type transistors disposed in the same N-well NWB. Table 2 shows the voltages applied to the source line SLB, the word line WLB, the bit lines BLB1 and BLB2, the erase line ELB, and the N-well NWB during the enroll operation, the erase operation, and the read operation.

TABLE 2

|  | Enroll operation | Erase operation | Read operation |
| --- | --- | --- | --- |
| SLB | VPP | V0 | VOP3 |
| WLB | VOP2 | V0 | V0 |
| BLB1/BLB2 | V0 | V0 | VR |

TABLE 2-continued

|  | Enroll operation | Erase operation | Read operation |
|---|---|---|---|
| ELB | VPP | VEE | V0 |
| NWB | VPP | V0 | VOP3 |

According to table 2, during the enroll operation of the random bit cell 122, the source line SLB, the erase line ELB, and the N-well NWB can be at the program voltage VPP, the word line WLB can be at an operation voltage VOP2, and the bit lines BLB1 and BLB2 can be at the reference voltage V0. In some embodiments, the program voltage VPP can be greater than the operation voltage VOP2, and the operation voltage VOP2 can be greater than the reference voltage V0. For example, but not limited to, if the program voltage VPP is 8V and the reference voltage V0 is 0V, the operation voltage VOP2 can be 7V.

In this case, the selection transistor SLTB can be turned on. However, if the storage transistors STB1 and STB2 are not programmed before, the resistance of the storage transistors STB1 and STB2 would be rather high. Therefore, the voltage of the second terminal of the selection transistor SLTB will be raised to a voltage close to the program voltage VPP. In this case, due to the variations between storage transistors STB1 and STB2 caused during the manufacturing process, one of the storage transistors STB1 and STB2 may be more inclined to induce the channel hot electron injection, and thus will be programmed first. Once one of the storage transistors STB1 and STB2 is programmed, that is, once the electrons are injected to the floating gate of one of the storage transistors STB1 and STB2, the resistance of the programmed storage transistor will decrease quickly and may become similar to the turn-on resistance of the selection transistor SLTB. Consequently, the voltage of the second terminal of the selection transistor SLTB will decrease, preventing the other storage transistor from being programmed.

Therefore, after the enroll operation, only one of the storage transistors STB1 and STB2 will be programmed. However, since it is not possible to predict which storage transistor STB1 or STB2 will be programmed, the program states of the storage transistors STB1 and STB2 can be used to represent the random bit. For example, if the storage transistor STB1 is programmed and the storage transistor STB2 is not programmed, the random bit may be deemed to have a value "1". On the other hand, if the storage transistor STB2 is programmed and the storage transistor STB1 is not programmed, the random bit may be deemed to have a value "0".

Also, during the read operation, the source line SLB and the N-well NWB can be at the operation voltage VOP3, the bit lines BLB1 and BLB2 can be pre-charged to the read voltage VR, and the erase line ELB and the word line WLB can be at the reference voltage V0.

In this case, the select transistor SLTB can be turned on. Also, if the storage transistor STB1 has been programmed while the storage transistor STB2 has not been programmed, then the storage transistor STB1 will induce a read current flowing from the source line SLB to the bit line BLB1 while no read current or only an insignificant current will be induced on the bit line BLB2. On the other hand, if the storage transistor STB1 has not been programmed while the storage transistor STB2 has been programmed, then the read current will flow to the bit line BLB2 while no read current or only an insignificant current will be induced on the bit line BLB1.

Therefore, by sensing the currents on the bit lines BLB1 and BLB2 with the sense amplifier 130, the programming state of the random bit cell 122 can be determined, and the random bit can be read.

In some embodiments, the sense amplifier 130 can compare the current on the bit line BLB1 with the current on the bit line BLB2 to determine the random bit. That is, the sense amplifier 130 can be designed to sense the currents differentially. Similarly, in this case, during the read operation of the non-volatile memory cell 112, the sense amplifier 130 can compare the read current on the bit line BLA and a reference current generated by a reference memory cell to determine a read data bit. Therefore, the sense amplifier 130 can be used for both the read operations of the random bit cell 122 and the non-volatile memory cell 112.

However, in some other embodiments, during the read operation of the random bit cell 122, the sense amplifier 130 may compare the current on the bit line BLB1 or BLB2 with a predetermined reference current to determine the random bit. That is, the sense amplifier 130 can be designed to be single ended, and only one of the bit lines BLB1 and BLB2 will be sensed since the programming states of the storage transistors STB1 and STB2 should be complementary. In this case, during the read operation of the non-volatile memory cell, the sense amplifier 130 will also compare the read current on the bit line BLA and a predetermined reference current to determine the read data bit. Therefore, the sense amplifier 130 can still be used for both the read operations of the random bit cell 122 and the non-volatile memory cell 112.

Furthermore, in some embodiments, the random bit cell 122 can also be erased by performing the erase operation. According to table 2, during the erase operation of the random bit cell 122, the source line SLB, the bit lines BLB1 and BLB2, the word line WLB, and the N-well NWB can be at the reference voltage V0, and the erase line ELB can be at the erase voltage VEE. In this case, electrons captured by the floating gate of the storage transistor STB1 or STB2 will be ejected through the erase element EGB1, EGB2, and the random bit cell 122 can be erased.

In some embodiments, since the voltages used for the operations of the non-volatile memory block 110 and the random bit block 120 are very similar, the non-volatile memory block 110 and the random bit block 120 can use the same voltage generator.

For example, in FIG. 1, the memory system 100 can further include a band-gap regulator 140, a high voltage generator 150, and control circuits 160 and 170.

The band-gap regulator 140 can provide a band-gap reference voltage $V_{BDG}$. The high voltage generator 150 can be coupled to the band-gap regulator 140, and can generate a plurality of voltages according to the band-gap reference voltage 140. In this case, the control circuit 160 can be coupled to the high voltage generator 150 and the non-volatile memory block 110, and can transmit the required voltages to the non-volatile memory cells 112 according to the voltages generated by the high voltage generator 150. Also, the control circuit 170 can be coupled to the high voltage generator 150 and the random bit block 120, and can transmit the required voltages to the random bit cells 122.

That is, with the control circuits 160 and 170 selecting the voltages required by the non-volatile memory block 110 and the random bit block 120, the non-volatile memory block 110 and the random bit block 120 can both use the voltages provided by the high voltage generator 150. Therefore, the area of the memory system 100 can be further reduced.

Since the memory system 100 can include both the non-volatile memory block 110 for storing data and the random bit block 120 for providing the random bits, the data stored in the non-volatile memory block 110, such as the firmware program, can be protected by the security key generated by the random bits provided by the random bit block 120, improving the information security of the memory system 100. Furthermore, since the non-volatile memory block 110 and the random bit block 120 can be implemented by the same types of transistors, the non-volatile memory block 110 and the random bit block 120 can be manufactured in the same process and can even share the sense amplifiers 130 and the voltage generator 150, reducing the area and cost of the memory system 10.

Although in FIG. 2 and FIG. 3, the storage transistors STA, STB1, and STB2 of the non-volatile memory cells 112 and the random bit cells 122 are floating gate transistors (i.e. transistors having floating gate structures), the storage transistors STA, STB1, and STB2 can also be transistors having other types of charge trapping structures.

Figure 4:
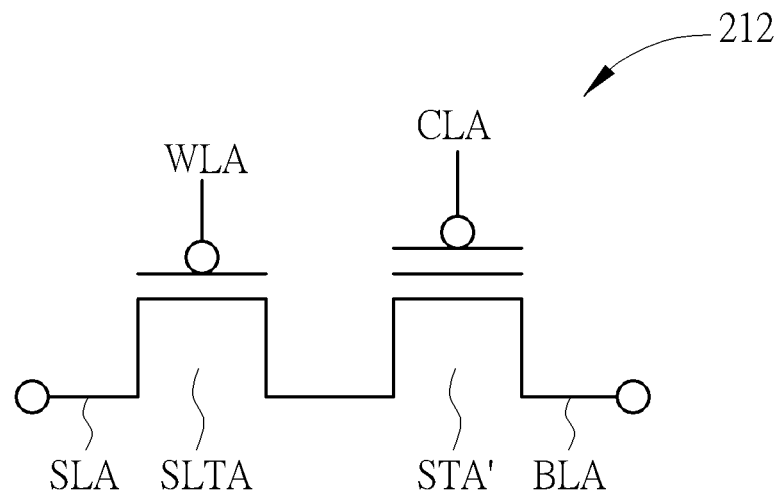
FIG. 4 shows a non-volatile memory cell according to another embodiment of the present invention.

FIG. 4 shows a non-volatile memory cell 212 according to one embodiment of the present invention. In some embodiments, the non-volatile memory cells 212 can be adopted by the non-volatile memory block 110 to replace the non-volatile memory cells 112.

The non-volatile memory cell 212 includes a select transistor SLTA and a storage transistor STA'. The select transistor SLTA has a first terminal coupled to a source line SLA, a second terminal, and a control terminal coupled to a word line WLA. The storage transistor STA' has a first terminal coupled to the second terminal of the select transistor SLTA, a second terminal coupled to a bit line BLA, and a stack gate terminal coupled to a control line CLA. In some embodiments, the storage transistor STA' can be a silicon-oxide-nitride-oxide-silicon (SONOS) transistor, that is, the stack gate of the storage transistor STA' can be formed by silicon layers, oxide layers, and a nitride layer.

In some embodiments, the non-volatile memory cell 212 can be programmed by inducing the hot electron injection as the non-volatile memory cell 112, and the electrons can be captured by the stack gate of the storage transistor STA'.

Figure 5:
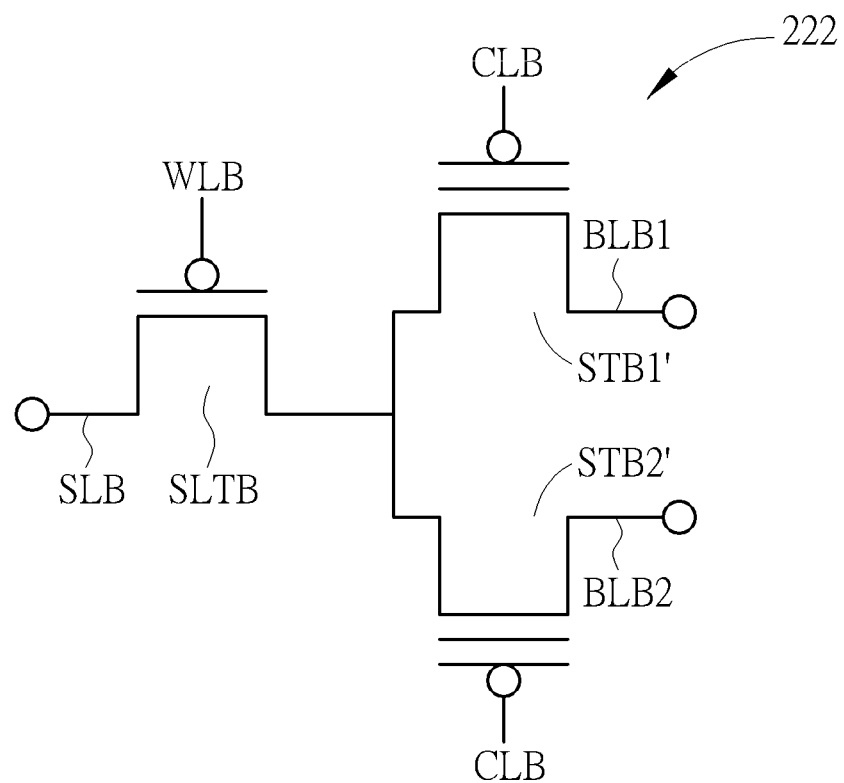
FIG. 5 shows a random bit cell according to another embodiment of the present invention.

Similarly, the random bit cell can be implemented with stack gate transistors. FIG. 5 shows a random bit cell 222 according to one embodiment of the present invention. In some embodiments, the random bit cells 222 can be adopted by the random bit block 120 to replace the non-volatile memory cells 122.

The random bit cell 222 includes a select transistor SLTB and storage transistors STB1' and STB2'. The select transistor SLTB has a first terminal coupled to a source line SLB, a second terminal, and a control terminal coupled to a word line WLB. The storage transistor STB1' has a first terminal coupled to the second terminal of the select transistor SLTB, a second terminal coupled to a bit line BLB1, and a stack gate terminal coupled to a control line CLB. The storage transistor STB2' has a first terminal coupled to the second terminal of the select transistor SLTB, a second terminal coupled to a bit line BLB2, and a stack gate terminal coupled to the control line CLB.

In some embodiment, the enroll operation of the random bit cell 222 can be performed with similar principles as used by the enroll operation of the random bit cell 122. That is, by applying proper electric fields on the storage transistors STB1' and STB2', one of the storage transistors STB1' and STB2' will induce the hot electron injection first and prevent the other storage transistor from being programmed. Therefore, after the enroll operation, the storage transistors STB1' and STB2' will have different program states according to the intrinsic characteristics of the storage transistors STB1' and STB2'. Since the program states of the storage transistors STB1' and STB2' caused by the enroll operation are unpredictable, the program states can be used to represent the random bit.

Since the non-volatile memory cell 212 and the random bit cell 222 can be implemented with the same type of storage transistors, the non-volatile memory cell 212 and the random bit cell 222 can be manufactured in the same process and can even share the sense amplifiers and the voltage generator, reducing the area and cost of the memory system 100.

In summary, the memory systems provided by the embodiments of the present invention can include both the non-volatile memory block for storing data and the random bit block for providing the random bits. Therefore, the data stored in the memory block, such as the firmware program, can be protected by the security key generated by the random bits provided by the random bit block, improving the information security of the memory system. Furthermore, since the non-volatile memory block and the random bit block can be implemented by the same type of transistors, the non-volatile memory block and the random bit block can be manufactured in the same process and can even share the sense amplifiers and the voltage generator, reducing the area and cost of the memory system.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A memory system comprising:
   a non-volatile memory block comprising a plurality of non-volatile memory cells configured to store a plurality of bits of data, each of the plurality of non-volatile memory cells comprising a first storage transistor;
   a random bit block comprising a plurality of random bit cells configured to provide a plurality of random bits, each of the plurality of random bit cells comprising a second storage transistor and a third storage transistor; and
   at least one sense amplifier coupled to the non-volatile memory block and the random bit block, and configured to sense a first read current of a non-volatile memory cell of the plurality of non-volatile memory cells during a read operation of the non-volatile memory cell and sense at least a second read current of a random bit cell of the plurality of random bit cells during a read operation of the random bit cell;
   wherein the first storage transistor, the second storage transistor, and the third storage transistor are storage transistors of a same type.
2. The memory system of claim 1, wherein:
   each of the plurality of non-volatile memory cells further comprises a first select transistor and a first erase element;
   the first select transistor has a first terminal coupled to a first source line, a second terminal, and a control terminal coupled to a first word line;

the first storage transistor has a first terminal coupled to the second terminal of the first select transistor, a second terminal coupled to a first bit line, and a floating gate terminal; and the first erase element having a first terminal coupled to the floating gate terminal of the first storage transistor, and a second terminal coupled to a first erase line.

3. The memory system of claim 2, wherein:

each of the plurality of random bit cells further comprises a second select transistor, a second erase element, and a third erase element;

the second select transistor has a first terminal coupled to a second source line, a second terminal, and a control terminal coupled to a second word line;

the second storage transistor has a first terminal coupled to the second terminal of the second select transistor, a second terminal coupled to a second bit line, and a floating gate terminal;

the third storage transistor has a first terminal coupled to the second terminal of the second select transistor, a second terminal coupled to a third bit line, and a floating gate terminal;

a second erase element has a first terminal coupled to the floating gate terminal of the second storage transistor, and a second terminal coupled to a second erase line; and a third erase element has a first terminal coupled to the floating gate terminal of the third storage transistor, and a second terminal coupled to the second erase line.

4. The memory system of claim 3, wherein the first select transistor and the first storage transistor are P-type transistors disposed in a first N-well, and during a program operation of each of the plurality of non-volatile memory cells:

the first source line and the first N-well are at a program voltage;

the first word line is at a first operation voltage;

the first bit line is at a reference voltage; and the first erase line ramps from the reference voltage to the first operation voltage; and wherein the program voltage is greater than the first operation voltage, and the first operation voltage is greater than the reference voltage.

5. The memory system of claim 4, wherein the second select transistor, the second storage transistor and the third storage transistor are P-type transistors disposed in a second N-well, and during an enroll operation of each of the plurality of random bit cells:

the second source line, the second erase line, and the second N-well are at the program voltage;

the second word line is at a second operation voltage; and the second bit line and the third bit line are at the reference voltage; and wherein the program voltage is greater than the second operation voltage, and the second operation voltage is greater than the reference voltage.

6. The memory system of claim 3, wherein during a read operation of each of the plurality of non-volatile memory cells:

the first source line is at a third operation voltage;

the first bit line is pre-charged to a read voltage; and the first erase line, and the first word line are at a reference voltage; and wherein the third operation voltage is greater than the read voltage, and the read voltage is greater than the reference voltage.

7. The memory system of claim 6, wherein during a read operation of each of the plurality of random bit cells:

the second source line is at the third operation voltage;

the second bit line and the third bit line are pre-charged to the read voltage; and the second erase line, and the second word line are at the reference voltage.

8. The memory system of claim 3, wherein during an erase operation of each of the plurality of non-volatile memory cells:

the first source line, the first bit line, and the first word line are at a reference voltage; and the first erase line is at an erase voltage; and wherein the erase voltage is greater than the reference voltage.

9. The memory system of claim 8, wherein during an erase operation of each of the plurality of random bit cells:

the second source line, the second bit line, the third bit line, and the second word line are at the reference voltage; and the second erase line is at the erase voltage.

10. The memory system of claim 1, wherein:

during a read operation of each of the plurality of non-volatile memory cells, the sense amplifier compares the first read current on the first bit line and a reference current generated by a reference memory cell to determine a read data bit; and during a read operation of each of the plurality of random bit cells, the sense amplifier senses the second current on the second bit line and the third current on the third bit line to determine a random bit.

11. The memory system of claim 1, wherein:

during a read operation of each of the plurality of non-volatile memory cells, the sense amplifier compares the first read current on the first bit line and a first predetermined reference current to determine a read data bit; and during a read operation of each of the plurality of random bit cells, the sense amplifier senses the second current on the second bit line and a second predetermined reference current to determine a random bit.

12. The memory system of claim 1, further comprising:

a band-gap regulator configured to provide a band-gap reference voltage;

a high voltage generator coupled to the band-gap regulator and configured to generate a plurality of voltages according to the band-gap reference voltage;

a first control circuit coupled to the high voltage generator and the non-volatile memory block, and configured to transmit required voltages of the plurality of voltages to the plurality of non-volatile memory cells; and a second control circuit coupled to the high voltage generator and the random bit block, and configured to transmit required voltages of the plurality of voltages to the plurality of random bit cells.

13. The memory system of claim 1, wherein:

each of the plurality of non-volatile memory cells further comprises a first select transistor;

the first select transistor has a first terminal coupled to a first source line, a second terminal, and a control terminal coupled to a first word line; and the first storage transistor has a first terminal coupled to the second terminal of the first select transistor, a second terminal coupled to a first bit line, and a stack gate terminal coupled to a first control line.

14. The memory system of claim 13, wherein:

each of the plurality of random bit cells further comprises a second select transistor;

the second select transistor has a first terminal coupled to a second source line, a second terminal, and a control terminal coupled to a second word line;

the second storage transistor has a first terminal coupled to the second terminal of the second select transistor, a second terminal coupled to a second bit line, and a stack gate terminal coupled to a second control line; and the third storage transistor has a first terminal coupled to the second terminal of the second select transistor, a second terminal coupled to a third bit line, and a stack gate terminal coupled to the second control line.

15. The memory system of claim 1, wherein each of the first storage transistor, the second storage transistor, and the third storage transistor has a charge trapping structure.

16. The memory system of claim 1, wherein each of the first storage transistor, the second storage transistor, and the third storage transistor has a floating gate structure.

\* \* \* \* \*